United States Patent [19]

Lomholt

[11] Patent Number: 5,789,901
[45] Date of Patent: Aug. 4, 1998

[54] APPARATUS WITH RECHARGEABLE BATTERIES AND A DEVICE FOR CALCULATING AND INDICATING THE NUMBER OF REMAINING USE SESSIONS OF THE APPARATUS

[75] Inventor: Ole Lomholt, Drachten, Netherlands

[73] Assignee: U.S. Philips Corporation, New York, N.Y.

[21] Appl. No.: 762,685

[22] Filed: Dec. 11, 1996

[30] Foreign Application Priority Data

Dec. 14, 1995 [EP] European Pat. Off. ............. 95203482

[51] Int. Cl.⁶ ....................................................... H02J 7/00
[52] U.S. Cl. ................. 320/134; 320/136; 320/DIG. 21; 324/427; 340/636
[58] Field of Search ...................... 320/48, 43, 44, 320/45, 39, 40, 30, 31, DIG. 18, DIG. 21, 134, 136, 127; 324/427, 428, 433, 435, 436; 340/636

[56] References Cited

U.S. PATENT DOCUMENTS

| | | | |
|---|---|---|---|
| 4,638,237 | 1/1987 | Fernandez | 320/DIG. 21 |
| 5,130,659 | 7/1992 | Sloan | 320/136 |
| 5,144,218 | 9/1992 | Bosscha . | |
| 5,182,655 | 1/1993 | Motoyannagi | 358/406 |
| 5,248,929 | 9/1993 | Burke | 320/DIG. 21 |
| 5,333,176 | 7/1994 | Burke et al. | 379/58 |
| 5,455,499 | 10/1995 | Uskali et al. | 320/DIG. 21 |

*Primary Examiner*—Peter S. Wong
*Assistant Examiner*—K. Shin

[57] ABSTRACT

Apparatus with rechargeable battery (B), a load (MR) and a power supply (PS) for charging the battery (B). When the load (MR) receives current from the battery (B) the charge consumed by the load (MR) is measured by means of a series resistor (RS) and a voltage-to-frequency converter (VFC). A microcontroller (MC) computes the average charge consumed per session of usage and computes the number of remaining sessions of usage from the actual charge in the battery (B) and the average charge per session and shows this number on a display (D).

12 Claims, 5 Drawing Sheets

APPARATUS WITH RECHARGEABLE BATTERIES AND A DEVICE FOR CALCULATING AND INDICATING THE NUMBER OF REMAINING USE SESSIONS OF THE APPARATUS

The invention relates to an apparatus comprising: a rechargeable battery; a load; means for connecting the load to the battery during a session; means for charging the battery; means for monitoring the state of charge of the battery and for generating a signal representing a remaining amount of charge in the battery.

Such an apparatus, particularly a shaver, is known and is sold by Philips Electronics under type number HS 990. This shaver comprises a rechargeable battery for feeding a motor and a LCD display for indicating the remaining shaving time which is left until the battery is empty. In this apparatus the available charge in the battery is computed from the duration of and the value of the current consumed by the motor. The average current per shave session is computed and the remaining capacity is divided by the calculated average current consumption to obtain a prediction of the remaining shaving time. The display shows the user of the shaver the number of "minutes left" before the battery is empty.

In practice the user of the shaver is not always able to judge whether or not the minutes left, indicated on the display, are sufficient for the next shave sessions. It is an object of the invention to provide an apparatus with an improved indication which is more related to the usage pattern of the apparatus. These and other objects are achieved in an apparatus as specified in the opening paragraph, characterised in that the apparatus further comprises: means for measuring a session charge flowing from the battery to the load during a session; means for counting a number of sessions; first means for calculating a total charge consumed during the number of sessions; second means for calculating an average session charge from the total charge and the number of sessions; third means for calculating a number of remaining sessions from the remaining amount of charge in the battery and the average session charge; and means for displaying the number of remaining sessions.

According to the invention the average charge used per session, for instance a shave session, is computed from a number of previous sessions. The actual charge in the battery is monitored during charging and discharging of the battery. From the actual charge and the average charge per session a number is computed and displayed, which number is indicative of the number of sessions left before the battery is empty. The user of a shaver is normally not aware of the duration of a shave session, but he very well knows his own usage pattern, for instance once a day or twice a day. The number of "shaves left" on a shaver according to the invention makes it much easier to decide how many times the shaver can be used before the battery has to be recharged. For instance, when the user leaves for a business trip, he can immediately see whether the battery of the shaver has enough charge for the next days of the trip.

The apparatus may be a shaver, but also in other apparatuses with rechargeable batteries having a more or less regular usage pattern the invention can be employed, such a electrical depilators, toothbrushes, dental showers, screw drivers, drills, vacuum cleaners, mixers and the like. The term battery is here intended to refer to one or more individual rechargeable cells or to a battery pack.

An embodiment of the apparatus according to the invention is characterised in that the second means for calculating are operative to treat sessions separated by less than a predetermined amount of time as a single session. This ensures that sessions separated by short intervals of non-usage are treated as a single session. Thus the effect of "playing" with the apparatus on the calculation of the average session charge is reduced. The calculation of the average charge may be further improved in an embodiment which is characterised in that the second means for calculating are operative to ignore sessions shorter than a minimum time and/or in that the second means for calculating are operative to ignore sessions longer than a maximum time. In this way unusually short and long sessions are not included in the calculation of the average charge consumption.

An embodiment of the apparatus according to the invention is characterised in that during charging of the battery, the third means for calculating are operative to calculate the number of remaining sessions from the remaining amount of charge after subtracting of a safety charge margin, using the most recently calculated average session charge. Since the average charge used per session may change in course of time, the computed number of sessions left is updated to the most recent data available after a recharge of the battery. The available number of sessions left is in this way adapted to a changing usage pattern of the apparatus. The margin provides build-in safety which prevents unexpected occurrence of an empty battery.

A further embodiment of the apparatus according to the invention is characterised in that during a session, the third means for calculating are operative to calculate an upper limit value for the number of remaining sessions from the remaining amount of charge using the average session charge employed during the last charging of the battery. The upper limit value prevents inaccurate computations in case the most recently average charge per session deviates from the average charge per session employed during the last charging period of the battery.

The battery can be charged in any suitable way. The monitoring of the state of charge of the battery, however, can be simplified in an embodiment which is characterised in that the means for charging the battery comprises a constant current source for charging the battery with a constant current. By charging the battery with a constant current, the accumulated charge in the battery can be computed easily by counting the time during which the constant current flows into the battery.

The above object and features of the present invention will be more apparent from the following description of the preferred embodiments with reference to the drawings, wherein.

Figure 1:
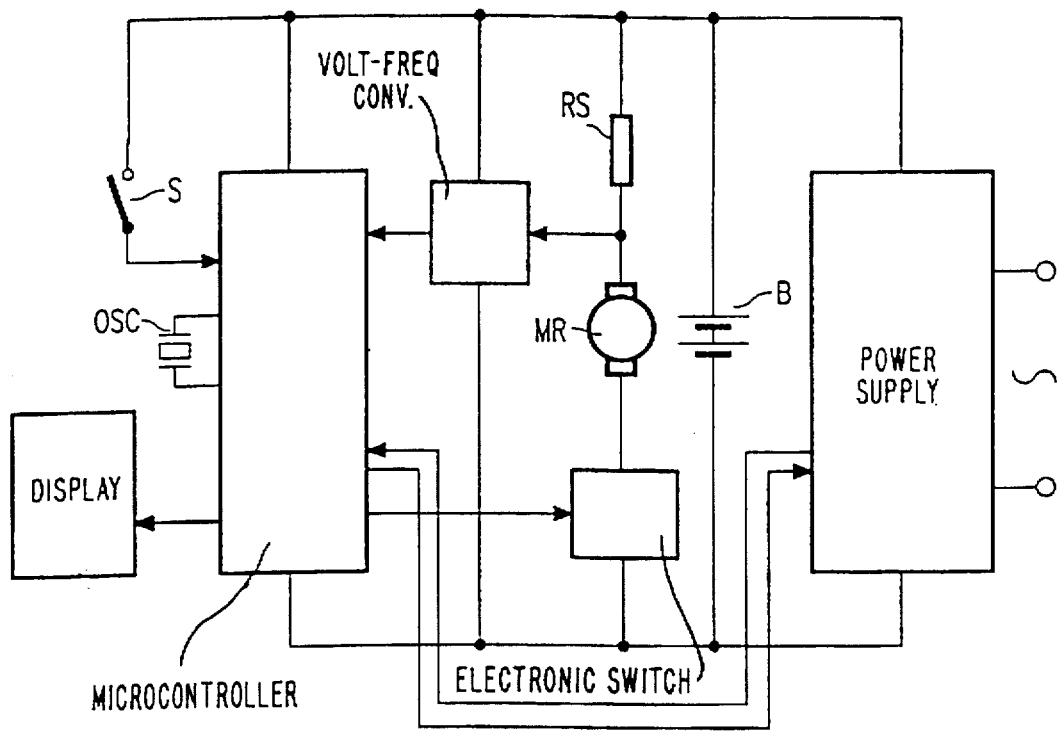
FIG. 1 shows an electronic block diagram of an apparatus according to the invention.

FIG. 1 shows a functional block diagram of an apparatus according to the invention. The apparatus is, by way of example, a rechargeable shaver, but the same holds for other rechargeable apparatuses such as electrical depilators, toothbrushes, dental showers, screw drivers, drills, vacuum cleaners, mixers and the like. These apparatuses have in common that they are used in "sessions" separated by pauses of non-use. A shaver, for instance, is typically used once a day; so the pause is nearly a day. An electric screw driver is often used in a series of rather short sessions separated by rather short pauses. So, each of the above mentioned apparatuses has its typical usage-pattern. The amount of energy consumed per session may vary considerably for the entire population of individual specimens of the same apparatus depending on the needs and behaviour of the user; but the amount of energy per session only varies little for each specimen since the user has a regular pattern of usage.

The shaver of FIG. 1 comprises a rechargeable battery B which is charged by a power supply PS. The battery provides current to a motor MR via a series resistor RS. An electronic switch ES connects the series resistor RS and motor MR to the battery B under control of a microcontroller MC which responds to an on/off switch S. The microcontroller MC sends data to a display D, for example a Liquid Crystal Display (LCD). The microcontroller MC has a time reference, for instance a clock oscillator OSC, from which basic time units of length $\Delta T$ are derived. When the electronic switch ES is closed, motor current flows through the series resistor RS, causing a voltage drop across this resistor which is proportional to the motor current. The voltage across the series resistor RS is converted by a voltage-to-frequency converter VFC into a series of pulses with a repetition frequency proportional to the motor current. The microcontroller MC counts the pulses per unit of time. Each pulse delivered to the microcontroller MC corresponds to a specific amount of charge $\Delta Q$ passing through the motor MR. An example of a voltage-to-frequency converter can be found in U.S. Pat. No. 5,144,218. During charging the power supply PS supplies a constant current to the battery B until the battery B is full or until the charging is interrupted. The power supply PS and the microcontroller MC communicate with each other, so that the microcontroller MC is able to keep track of the charge supplied by the power supply PS to the battery B by counting the charging time. The power supply PS can be any suitable commercially available switchable constant current source or the power supply from the aforementioned shaver HS 990.

When the motor MR runs the microcontroller computes the consumed charge based on the lapsed time units $\Delta T$ and the consumed charge units $\Delta Q$ during a shave. After a number of shaves the microcontroller MC computes the average charge per shave and the number of remaining shaves which are possible with the remaining charge in the battery B. This number is displayed on the display D as an integer number which indicates the number of "shaves left". The average charge per shave is computed by summing the individual charges consumed during a series of shaves and by dividing the accumulated sum by the corresponding number of shaves.

Figure 2:
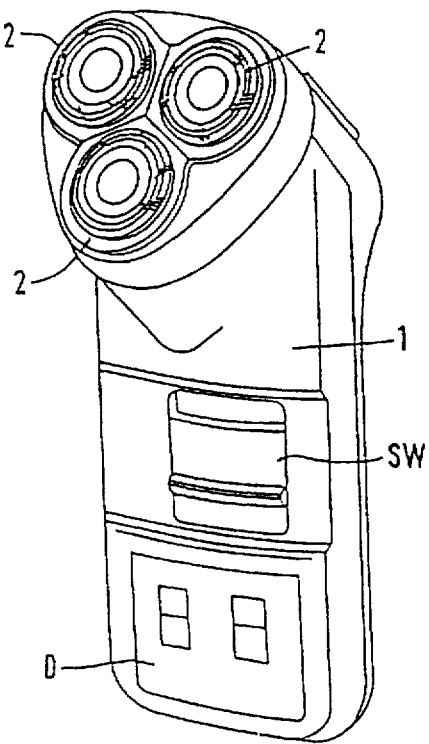
FIG. 2 shows a shaver according to the invention.
Figure 3:
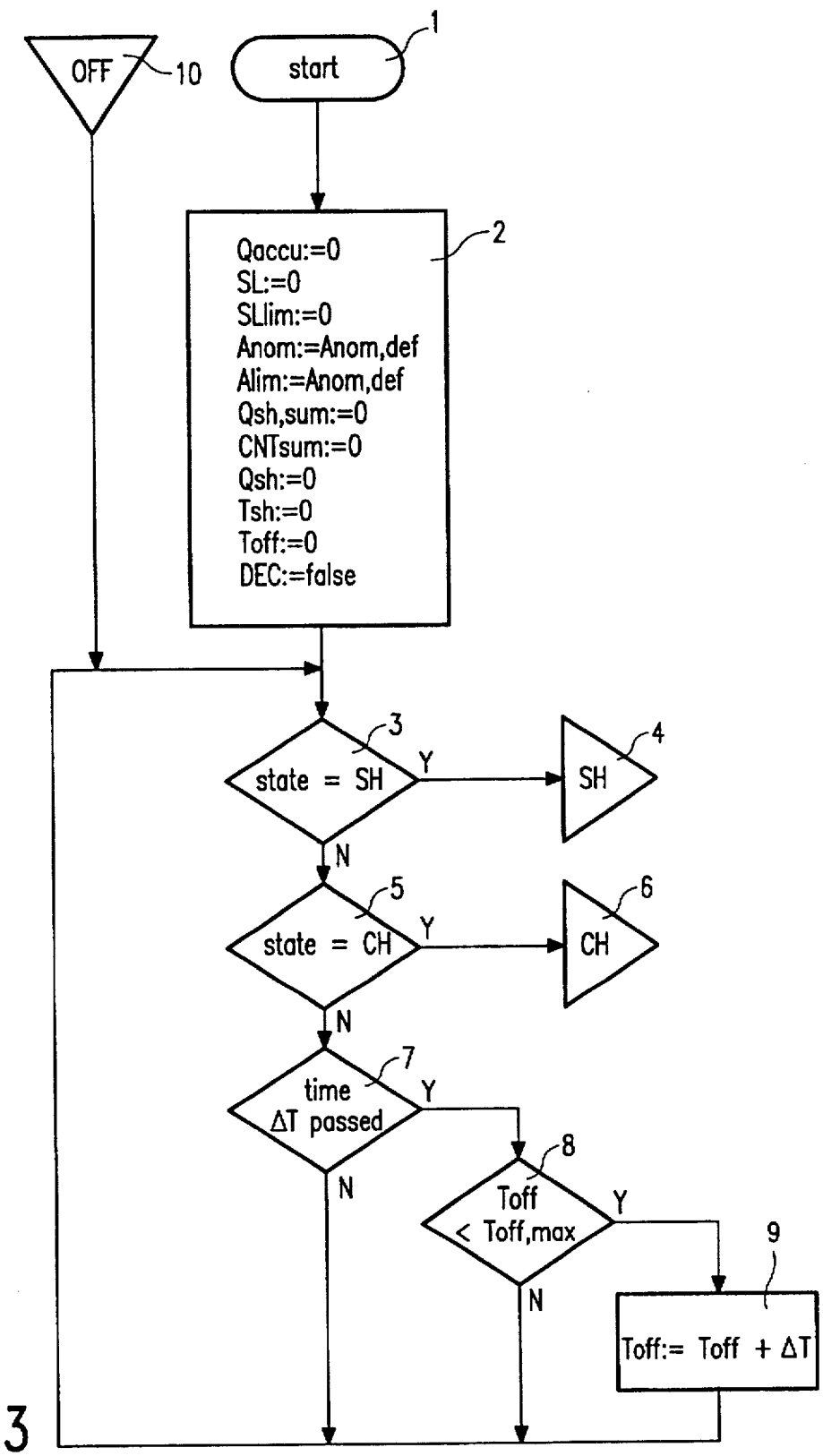
FIG. 3 shows part of a flow chart descriptive of the operation of an apparatus according to the invention.
Figure 4:
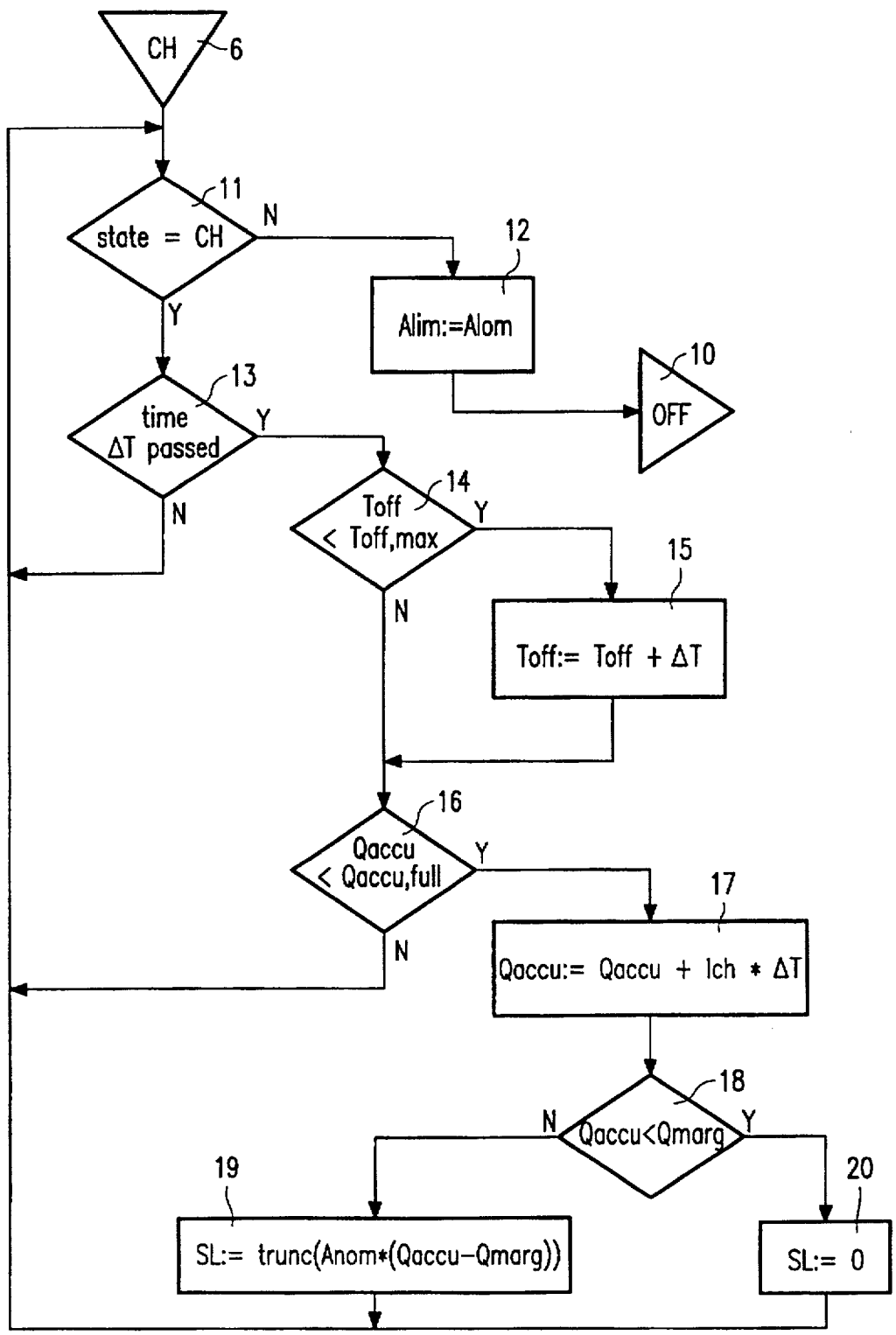
FIG. 4 shows part of a flow chart descriptive of the operation of an apparatus according to the invention.
Figure 5:
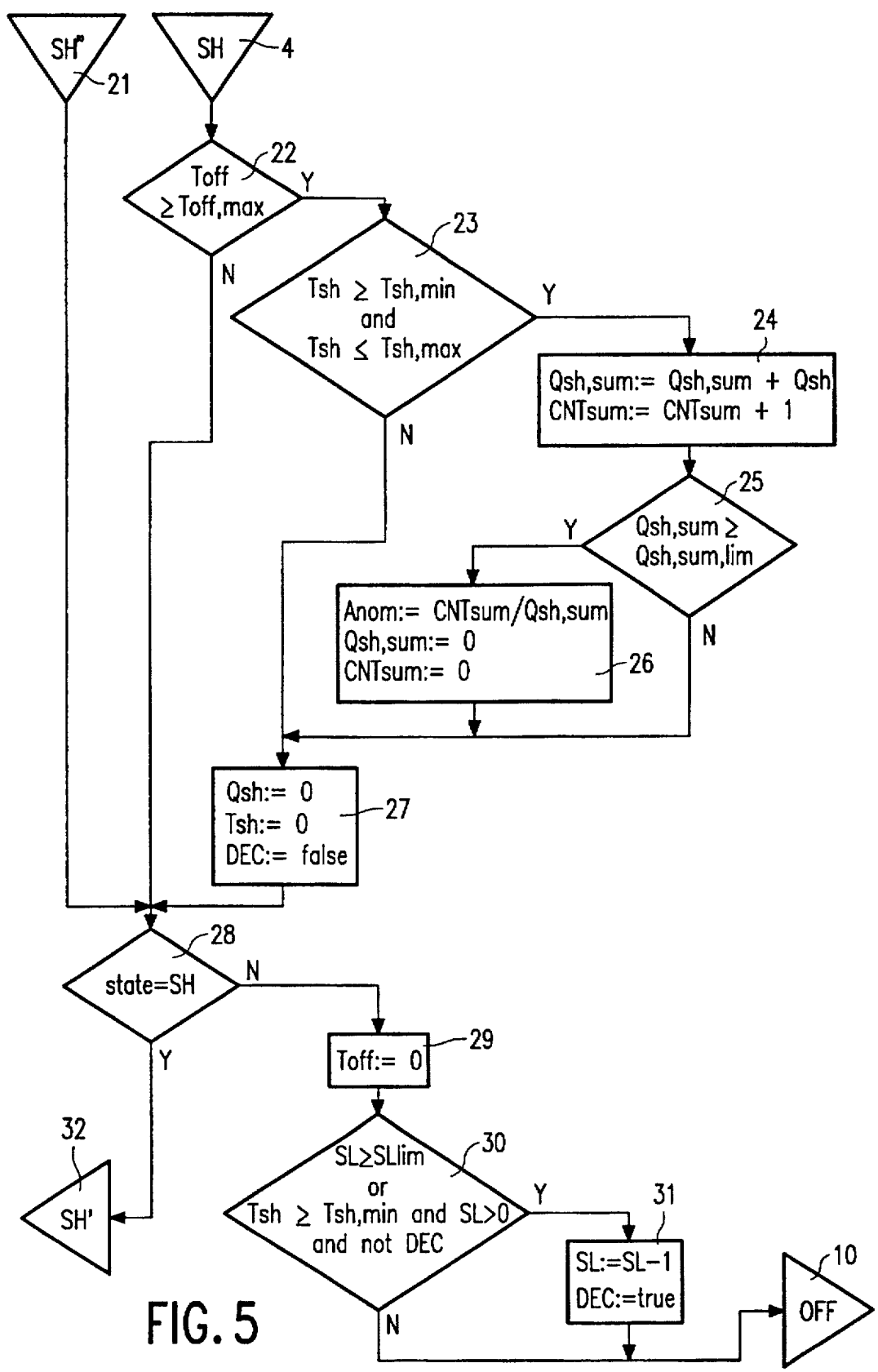
FIG. 5 shows part of a flow chart descriptive of the operation of an apparatus according to the invention.
Figure 6:
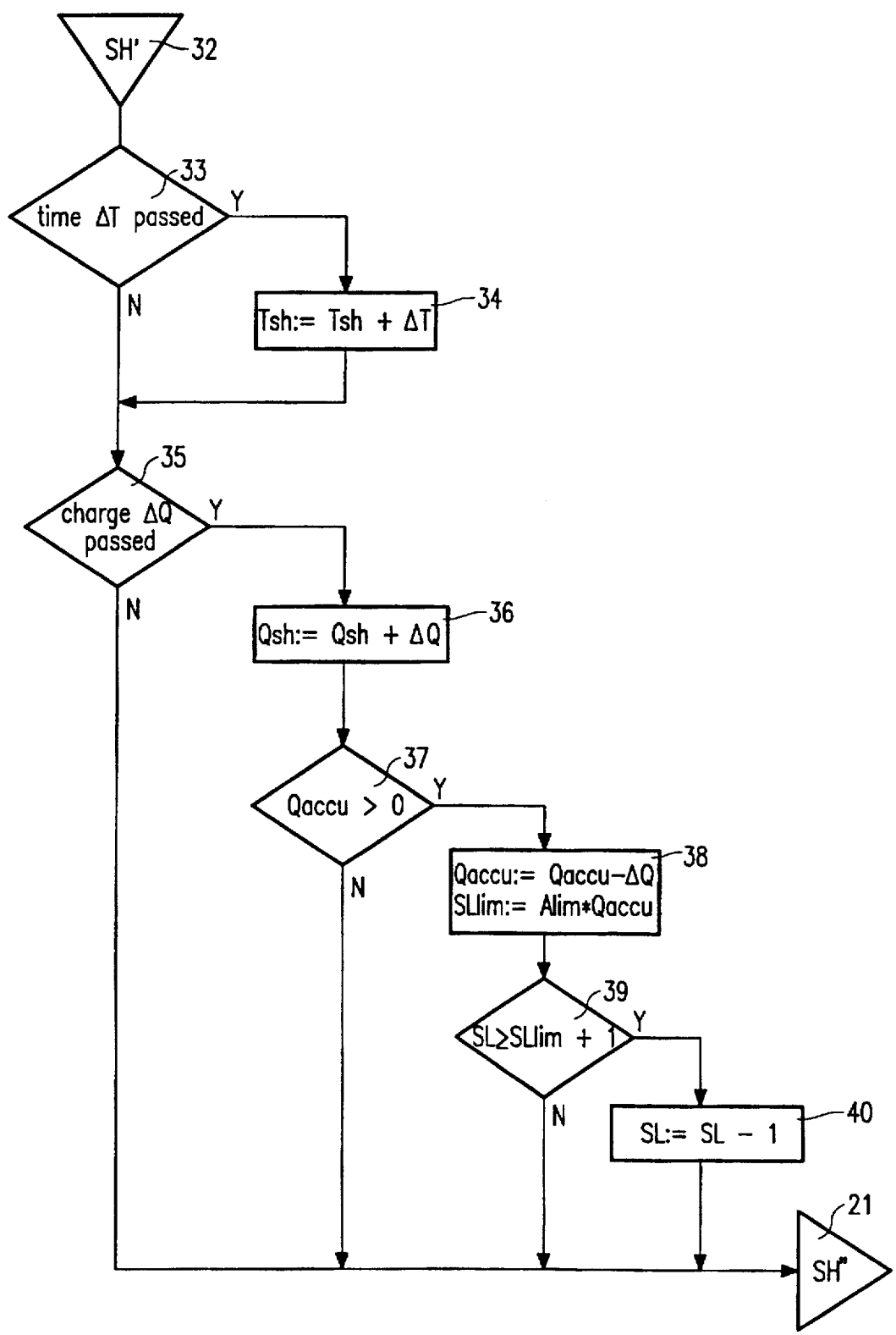
FIG. 6 shows part of a flow chart descriptive of the operation of an apparatus according to the invention.

FIG. 2 shows a shaver with an on/off switch SW and a display D. The shaving heads 2 are driven by the motor MR (not shown) inside the housing 1 which further accommodates the rechargeable battery B, the power supply PS, the electronic switch ES, the series resistor RS, the voltage-to-frequency converter VFC and the microcontroller MC (all not shown).

Different implementations are possible to achieve the above "shaves left" or, sated more generally, "sessions left" computation and indication. The following exemplary implementation will be elucidated with normal text, pseudo-code in a Pascal-like language and a flow chart which is shown in the FIGS. 3 to 6.

In this implementation the following assumptions are made:

The system operates in three states:
1. Shaving, referred to as SH;
2. Charging, referred to as CH;
3. Off, that is neither Shaving nor Charging, referred to as OFF.

Only transitions from SH to OFF and CH to OFF are considered.

The current measurement circuitry (RS, VFC) delivers pulses to the microcontroller MC; each pulse corresponds to a charge quantity $\Delta Q$ passing through the motor MR.

The microcontroller MC has a time reference (OSC) from which basic time units of length $\Delta T$ are derived by means of suitable program timing loops.

Charging of the battery B takes place with a constant current.

The value of "shaves left", referred to as SL is displayed as an integer value obtained by rounding the calculated value downwards. This operation is indicated by the term "trunc" (from truncate).

Further the following measures are taken to distinguish individual shaves (sessions) for the calculation of an average charge per shave:

Shaves separated by less than a certain amount of time (Toff,max) are regarded as effectively forming one shave.

Shaves of less than a certain minimum duration (Tsh,min) or more than a certain maximum duration (Tsh,max) are not included in the calculation of the average.

The average charge per shave is calculated by summing the charges of shaves until a limit charge (Qsh,sum,lim) is exceeded, and subsequently dividing this sum by the corresponding number of shaves.

During charging a value of "shaves left" (SL) is derived from the actual battery charge (Qaccu), after subtracting a safety margin (Qmarg), using the most recently calculated charge per shave.

During shaving an upper limit (SLlim) for the value of shaves left (SL) is derived from the actual battery charge (Qaccu), using the average charge per shave employed during the last charging period, which average is not necessarily equal to the most recently calculated average.

The displayed value of "shaves left" (SL) decrements after any shave exceeding the minimum duration (Tsh,min), even if not strictly required, that is, even if the value of "shaves left" (SL) does not exceed the upper limit value (SLlim). In this way an extra margin is built during shaves which are shorter than average. As a consequence the displayed value of "shaves left" is sometimes rather conservative.

The computation of the number of remaining sessions or "shaves left" will now be explained by means of a pseudo-code description in a Pascal-like language. Pascal is a computer programming language known to most programmers of microcontrollers. The operator ":=" implies that the expression at the right of the operator is assigned to the variable at the left of the operator. Text between braces { } is comment. A number between braces indicates the corresponding block in a flow chart to be discussed below. The pseudo-code description defines the constants and variables of the system and the actions corresponding to the following instances:

Actions at initialisation (at power up);
Actions per time unit $\Delta T$;
Actions per charge unit $\Delta Q$ during shaving (SH);
Actions at the state transitions from SH to OFF, from OFF to SH and from CH to OFF; no action is assumed at a transition from OFF to CH.

Constants:

| | |
|---|---|
| ΔT | basic time unit |
| ΔQ | basic charge unit |
| Ich | charging current (assumed constant) |
| Qaccu,full | full battery charge |
| Qmarg | charge margin |
| Tsh,min | lower time limit for a shave |
| Tsh,max | upper time limit for a shave |
| Toff,max | maximal pause within one shave |
| Qsh,sum,lim | charge limit for summing of charges |
| Anom,def | default value for Anom and Alim |

Variables:

| | |
|---|---|
| Qaccu | actual battery charge |
| Toff | duration of non-shaving |
| Qsh | charge of one shave |
| Tsh | duration of one shave |
| Qsh,sum | sum of individual Qsh's |
| CNTsum | counter for summing |
| SL | actual "shaves left" value, integer |
| SLlim | SL high limit value |
| Alim | actual ratio of SLlim to Qaccu |
| Anom | last calculated ratio of SLlim to Qaccu used for summing |
| DEC | boolean flag indicating whether the displayed value of SL has decremented during the current shave |

Actions at initialisation; corresponding to OFF and empty battery:

SL:=0;{2 }
SL:=0;{2 }
SLlim:=0;{2 }
Anom:=Anom.def;{2 }
Alim:=Anom.def;{2 }
Qsh.sum:=0;{2}
CNTsum:=0;{2}
Toff:=0;{2}
Tsh:=0;{2}
Qaccu:=
DEC:=false;{2}

Actions per unit of time ΔT:

```
case state of
    OFF:    if Toff < Toff,max {8}
            then Toff := Toff + ΔT;{9}
    SH:     Tsh := Tsh + ΔT;{34}
    CH:
    begin
            if Toff < Toff,max {14}
            then Toff := Toff + ΔT;{15}
            if Qaccu < Qaccu, full then {16}
            begin
                Qaccu := Qaccu + Ich * ΔT {17}
                if Qaccu < Qmarg then {18}
                    SL := 0 {20}
                else
                    SL := trunc(Anom * (Qaccu - Qmarg)); {19}
            end;
    end;
end; {case}
```

Actions per charge unit ΔQ, only during shaving (SH):

Qsh := Qsh + ΔQ; {36}
if Qaccu > 0 then {37}
begin
    Qaccu := Qaccu - ΔQ;{38}
    SLlim := Alim * Qaccu;{38}
    if SL ≥ SLlim + 1 {39} then SL := SL - 1;{40}
end;

Actions at transition from SH to OFF:

Toff := 0;{29}
if (SL ≥ SLlim) or (SL > 0)
    and (Tsh ≥ Tsh,min)
        and not DEC then {30}
begin
    SL := SL - 1;{31}
    DEC := true;{31}
end;

Actions at transition from OFF to SH:

if Toff ≥ Toff, max then {22}
begin
    if (Tsb ≥ Tsh,min) and (Tsh ≤ Tsh,max) then {23}
    begin
        Qsh,sum := Qsb,sum + Qsh;{24}
        CNTsum := CNTsum + 1;{24}
        if Qsh,sum ≥ Qsb,sum,lim then {25}
        begin
            Anom := CNTsum / Qsh,sum;{26}
            Qsh,sum := 0;{26}
            CNTsum := 0;{26}
        end;
    end;
    Qsh := 0;{27}
    Tsh := 0;{27}
    DEC := false;{27}
end;

Actions at transition from CH to OFF:
Alim:=Anom; {12}

FIGS. 3 to 6 show a flow chart description of the same implementation. The statements in the blocks of the flow chart are given in the same pseudo-code as above. The numbers of the blocks are indicated as comment in the corresponding lines the above pseudo-code description.

The algorithm as described above and shown in the flow chart may be refined to improve the performance.

The collection of data and the calculation of the average charge per shave may be improved by (a) handling the first series of sessions, where data are absent or scarce, differently or by (b) discarding old data gradually instead of all at once (block 26). For instance old data may be given a weighting factor and then used again in the next computation of the average charge per shave, before they are discarded.

The safety margin (Qmarg) may, instead of being constant over the entire discharging trajectory, increase gradually from a lower value, in the case of a full battery, to a higher value, in the case of an empty battery.

The safety margin (Qmarg) can be made adaptive with respect to the degree of variation of the charge per shave. A user with a rather irregular pattern of use will then get a slightly lower number of "shaves left" (SL) as compared with a user with the same average charge per shave, but with a more regular pattern of use.

The loss of battery charge due to "selfdischarge" of the battery may be taken into account by discounting during OFF units of selfdischarge from the actual charge in the battery.

Since the microcontroller MC communicates with the power supply PS, the microcontroller MC may recognise the situation that the power supply PS supplies part or all of the motor current directly from the mains.

The system may use a charging/discharging regime for the battery which is adaptive with respect to the (changing) battery capacity.

Instead of a constant current charger a power supply with varying charge current may be used as well. In that case the value of the charge current should be measured using the same series resistor RS and voltage-to-frequency converter VFC connected in series with the battery B during charging, or using a second resistor and converter. The implementation has been explained for a shaver. It will be clear that a similar approach can be used for the other apparatuses mentioned above. In that case a "shave" is to be interpreted as "session" and "shaves left" as "sessions left".

I claim:

1. An apparatus comprising: a rechargeable battery (B); a load (MR); means (ES) for connecting the load (MR) to the battery (B) during a session; means (PS) for charging the battery (B); means (MC, PS) for monitoring the state of charge of the battery (B) and for generating a signal representing a remaining amount of charge in the battery (B), wherein the apparatus further comprises: means (RS, VFC) for measuring a session charge flowing from the battery (B) to the load (MR) during a session; means (MC, S) for counting a number of sessions; first means (MC) for calculating a total charge consumed during the number of sessions; second means (MC) for calculating an average session charge from the total charge and the number of sessions; third means (MC) for calculating a number of remaining sessions from the remaining amount of charge in the battery (B) and the average session charge; and means (D) for displaying the number of remaining sessions.

2. An apparatus as claimed in claim 1, wherein the second means for calculating are operative to treat sessions separated by less than a predetermined amount of time as a single session.

3. An apparatus as claimed in claim 1, wherein the second means for calculating are operative to ignore sessions shorter than a minimum time.

4. An apparatus as claimed in claim 1, wherein the second means for calculating are operative to ignore sessions longer than a maximum time.

5. An apparatus as claimed in claim 1, wherein during charging of the battery, the third means for calculating are operative to calculate the number of remaining sessions from the remaining amount of charge after subtracting of a safety charge margin, using the most recently calculated average session charge.

6. An apparatus as claimed in claim 1, wherein during a session, the third means for calculating are operative to calculate an upper limit value for the number of remaining sessions from the remaining amount of charge using the average session charge employed during the last charging of the battery.

7. An apparatus as claimed in claim 1, wherein the means for charging the battery comprises a constant current source for charging the battery with a constant current.

8. An apparatus as claimed in claim 1, wherein the second means for calculating are operative to discard the session charge of previous sessions gradually for calculating the average session charge.

9. An apparatus as claimed in claim 5, wherein the safety charge margin increases gradually from a lower value, in the case of a relatively high remaining amount of charge in the battery, to a higher value, in the case of a relatively low remaining amount of charge in the battery.

10. An apparatus as claimed in claim 1, wherein the first means for calculating are operative to correct the total charge consumed during the sessions with a value representative for selfdischarge of the battery outside the sessions.

11. An apparatus as claimed in claim 1, wherein the apparatus is a shaver comprising a motor, the motor being the load.

12. An apparatus as claimed in claim 2 wherein the second means for calculating are operative to ignore sessions longer than a maximum time.

* * * * *